United States Patent [19]
Buck et al.

[11] Patent Number: 5,252,842
[45] Date of Patent: Oct. 12, 1993

[54] LOW-LOSS SEMICONDUCTOR DEVICE AND BACKSIDE ETCHING METHOD FOR MANUFACTURING SAME

[75] Inventors: Daniel C. Buck, Hanover; James E. Degenford, Dayton, both of Md.; Soong H. Lee, Seoul, Rep. of Korea; Scott A. Imhoff, Pasadena; Dale E. Dawson, Glen Burnie, both of Md.

[73] Assignee: Westinghouse Electric Corp., Pittsburgh, Pa.

[21] Appl. No.: 736,670

[22] Filed: Jul. 26, 1991

[51] Int. Cl.$^5$ ............... H01L 29/80; H01L 29/64; H01L 29/205; H01L 29/06
[52] U.S. Cl. .................. 257/280; 257/192; 257/619
[58] Field of Search ............... 357/22, 26, 55; 257/254, 256, 279–286, 419, 619, 192

[56] References Cited

U.S. PATENT DOCUMENTS

| | | | |
|---|---|---|---|
| 3,609,477 | 9/1971 | Drangeid et al. | 357/22 J |
| 4,040,168 | 8/1977 | Huang | 357/22 K |
| 4,183,033 | 1/1980 | Rees | 357/22 I |
| 4,498,093 | 2/1985 | Allyn et al. | 357/22 I |
| 4,503,709 | 3/1985 | Rühle | 357/26 |
| 4,635,343 | 1/1987 | Kuroda . | |
| 4,658,279 | 4/1987 | Guckel | 357/26 |
| 4,733,283 | 3/1988 | Kuroda . | |
| 4,821,093 | 4/1989 | Isfrate et al. . | |
| 5,037,782 | 8/1991 | Nakamura et al. | 357/55 |

OTHER PUBLICATIONS

Publication appearing in *Journal of the Electrical Chemical Society* Entitled "Selective Etching Characteristics of Peroxide/Ammonium-Hydroxide Solutions for GaAs/Al$_{0.16}$Ga$_{0.84}$As", by Kelly Kenefick.

Document Entitled "Processing, Fabrication, and Demonstration of High Temperature Ceramic Superconductors: Integrated Microwave Circuits of Multilayer YBCO Film Structures", Prepared by Westinghouse Electric Corp., Feb. 20, 1990.

*Primary Examiner*—Gene M. Munson
*Attorney, Agent, or Firm*—D. G. Maire

[57] ABSTRACT

A semiconductor device has material removed from the back of the substrate and a manufacturing process is provided for manufacturing these devices. In the exemplary embodiment, a GaAs FET chip is formed by a process including the step of etching the GaAs substrate from the back of the chip in a defined removal region to reduce the dielectric constant in the region of the source-to-drain path. A buffer layer of differing material provided between the active layers and the substrate prevents etching of the active layers during the removal process. To allow simplified etching patterns, the source-to-drain path may be laid out on the surface of the chip in a variety of patterns, including "packed" patterns concentrating a large path area in a small surface area of the chip. Optionally, this buffer layer may also be etched away in a further processing step. An insulating layer of material may be added to the back side of the chip in the etched region to increase structural strength, and a pressure relief ventilation path may be provided connecting the removal region to the outside at an edge or at the surface of the chip.

24 Claims, 4 Drawing Sheets

LOW-LOSS SEMICONDUCTOR DEVICE AND BACKSIDE ETCHING METHOD FOR MANUFACTURING SAME

FIELD OF THE INVENTION

The present invention relates generally to wideband semiconductor devices having low loss characteristics and to methods for constructing these devices.

BACKGROUND OF THE INVENTION

With reference to FIG. 1, integrated semiconductor devices such as Gallium Arsenide Field Effect Transistors (GaAs FETs), are constructed with a source region 100 and a drain region 102 connected by an N-channel layer 104 and separated by gate 106, all mounted on a GaAs substrate 108 having a metallized ground plane 109 on its back side. In operation, the gate 106 may be biased to permit a flow of electrons from source 100 to drain 102 through GaAs N-channel layer 104, which in this mode is undepleted in the region between source 100 and drain 102. The gate 106 may also be selectively biased to create a depletion region 112 in N-channel layer 104 in the vicinity of the gate 106, thus tending to separate undepleted regions 110 and 111 of N-channel layer 104 and limit the flow of electrons from source 100 through N-channel layer 104 to drain 102. When the gate is fully biased to a pinch-off voltage $V_{po}$, the depletion region 112 expands to separate undepleted regions 110 and 111 and essentially cut off the flow of electrons from source 100 to drain 102. However, in this pinch-off mode, capacitances appear between gate 106 and each of the now-separated undepleted regions 110 and 111 of N-channel layer 104. In addition, the inventors have determined that a third capacitance appears directly between undepleted region 110 and undepleted region 111.

These capacitances limit the usefulness of the semiconductor device because they reduce the off-state isolation of the device, allowing microwave-frequency signals to bypass the depletion region 112. In addition, at some cutoff frequency $f_{co}$, the effective impedance of these capacitances becomes equal to the resistance between source and drain when the gate-source voltage $V_{GS}=0$, so that the switch off state isolation equals the switch on state resistance. At or near this frequency, the device cannot be used for switching. The cutoff frequency $f_{co}$ is given by:

$$f_{co} = \frac{1}{2 \cdot PI \cdot R_s C_{SD}} \quad (1)$$

where $R_s$ is the series-equivalent resistance of the "on" state undepleted N-channel layer 104, and $C_{SD}$ is the pinch-off state drain-source capacitance. Although $f_{co}$ for certain PIN diodes is 500–1000 GigaHertz, GaAs FETs typically exhibit $f_{co}$ values of only about 150 GigaHertz. Thus, prior art GaAs FETs are of limited use in certain microwave and radar applications. It would be desirable to produce semiconductor switches such as GaAs FETs which exhibit lower losses and have a broader operating frequency band, but such devices have not been available.

Semiconductor etching is a well-known process which is generally used to prepare regions for subsequent contact deposition. As an example, U.S. Pat. No. 4,821,093 shows a dual-channel FET formed by etching a via opening through the back side of a semiconductor wafer and later depositing source, field plate, and drain contacts in the etched region. U.S. Pat. Nos. 4,733,283 and 4,635,343 show a GaAs semiconductor device made by etching a front side GaAs layer down to an Aluminum Gallium Arsenide (AlGaAs) etching-stoppable layer, and then forming a gate contact in the etched region. An article by K. Kenefick appearing in the Journal of the Electrochemical Society 129, No. 10, p. 2380 (1982) further illustrates general concepts of semiconductor layer etching.

As far as the inventors are aware, etching has not been used to remove back side substrate material in the absence of a desire to form some new structures on the back side of the substrate, or in any case for the purpose of reducing capacitance in a semiconductor device.

SUMMARY OF THE INVENTION

Therefore, it is a general object of the present invention to provide a novel semiconductor device with low-loss, wideband operating characteristics.

Another general object of the present invention is to provide a novel method of forming a semiconductor device having low loss and wideband operating characteristics.

A further general object of the present invention is to provide a novel FET in which a portion of the back side of a substrate is removed to improve $f_{co}$, reduce insertion loss, and increase operating bandwidth.

Yet another general object of the invention is to provide a novel semiconductor construction process in which a portion of the back side of a substrate is removed to produce a device having improved $f_{co}$, reduced insertion loss, and wideband operation.

Another object of the invention is to provide a GaAs FET semiconductor with improved loss and bandwidth characteristics.

A further object is to provide a semiconductor device in which substrate material is removed from the back of the chip in a defined removal region, with material having a reduced dielectric constant being substituted for the substrate in the defined region.

Another important object of the present invention is to provide a method of making a semiconductor device in which substrate material is removed from the back of the chip in a defined removal region, with material having a reduced dielectric constant being substituted for the substrate in the defined region.

It is another object of the invention to provide an FET device which has substrate material removed from defined regions proximate to the source-to-drain path.

Yet another object is to provide an FET device designed to facilitate reduction of substrate capacitive effects by removal of portions of the substrate, wherein the amount of the substrate that must be removed to achieve the desired effect is minimized.

Another object of the invention is to provide a multi-step etching process for removing material from the back side of a semiconductor device to reduce capacitive effects of the material with respect to the active layers of the device.

A further object of the invention is to provide a semiconductor device with a buffer layer of material different from material in the device substrate useful as an etch stop in at least one etching step.

It is also an object of the invention to provide a semiconductor device in which a pressure ventilation path is provided between a removal region on the bottom of the substrate and the outside of the device.

Another object of the invention is to simplify back-etching patterns in a process for making a transistor device by laying out the source-to-drain path on the surface of the chip in patterns having particular characteristics, such as the characteristic of concentrating a large path area in a small surface area of the chip.

These objects, and other important objects which will become apparent upon review of the specification and drawings, are achieved in the present invention by providing a novel semiconductor device having material removed from the back of the substrate and a manufacturing process for manufacturing these devices.

In the exemplary embodiment disclosed, a GaAs FET chip is formed by a process including the step of etching the GaAs substrate from the back of the chip in a defined removal region to reduce the dielectric constant in the region of the source-to-drain path. A buffer layer of non-GaAs material provided between the active layers and the substrate prevents etching of the active layers during the process. Optionally, this buffer layer may be etched away in a further processing step. An insulating layer of material may be added to the back side of the chip in the etched region to increase structural strength, and a pressure relief ventilation path may be provided from the removal region to an edge of the chip or through a small hole in the channel layer to the top of the chip. To allow simplified etching patterns, the source-to-drain path may be laid out on the surface of the chip in a variety of patterns, including "packed" patterns concentrating a large path area in a small surface area of the chip.

DETAILED DESCRIPTION OF THE INVENTION

In general, the present invention is a semiconductor device constructed on a substrate and a method of making the device. In the invention, substantially all of the substrate material on the back side of the device is removed beneath selected electrode regions to reduce operational losses and increase usable bandwidth. Although the concepts of the invention are not limited in application to any particular type of semiconductor device, the invention will be described herein with reference to a GaAs FET device which is a preferred embodiment of the invention.

Figure 2:
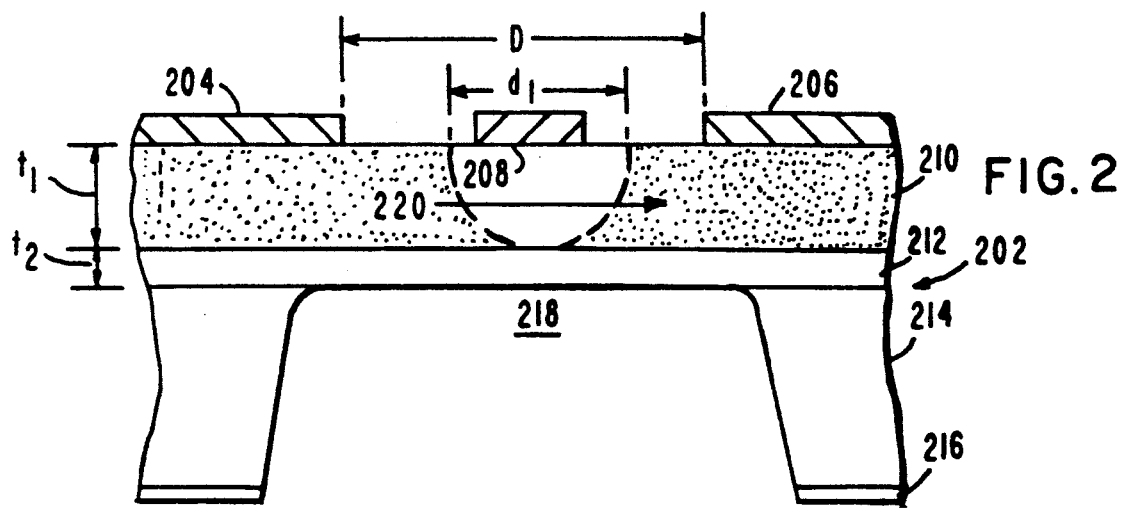
FIG. 2 is a cross-sectional view of a GaAs FET semiconductor device according to the present invention.

FIG. 2 shows a GaAs FET semiconductor device 202 according to the present invention. Semiconductor device 202 comprises a source region 204, drain region 206, and gate region 208. The ohmic contact regions 204 and 206, and the metal gate 208 are formed onto a channel layer 210 overlaying a buffer layer 212, which overlays semi-insulating GaAs wafer substrate 214 having field plate 216 on its back side. The source 204, drain 206, gate 208, and channel layer 210 make up the active layers of the device, in contrast to the substrate and field plate which are basically inactive in the passage of charge from source 204 to drain 206. Field plate 216 is a metallized layer used to establish a grounded plane in the device 202. The channel layer 210 may be a doped N-type GaAs channel layer, or it may be constructed from High Electron Mobility Transistor (HEMT) GaAs-GaAlAs material. Use of the HEMT material in channel layer 210 will have the desirable effect of reducing the on-state resistance of the device 202. As shown in FIG. 2, a portion of the substrate 214 and field plate 216 have been removed to form substrate removal region 218. The substrate removal region 218 constitutes a means for reducing the dielectric constant of the substrate, and thus its capacitive effect, in the region. The channel layer 210 provides a source-drain electron path 220.

A typical GaAs substrate 214 is semi-insulating and has a relative dielectric constant Epsilon$_r$ of about 12.9. Thus, the capacitance of substrate 214 is 12.9 times larger than the capacitance of air $C_{air}$, and is given by:

$$C = C_{air} \cdot Epsilon_r \qquad (2)$$

By forming a device 202 in which substrate 214 does not adjoin the region of channel layer 210 in at least a substantial part of the area under source 204, drain 206, and gate 208, the capacitance C is therefore substantially reduced to become closer to $C_{air}$. In actual devices constructed according to the principles disclosed herein, the capacitance C has been reduced to about half the capacitance of conventional devices, thus producing $f_{co}$ values of at least 300 GigaHertz.

Figure 1:
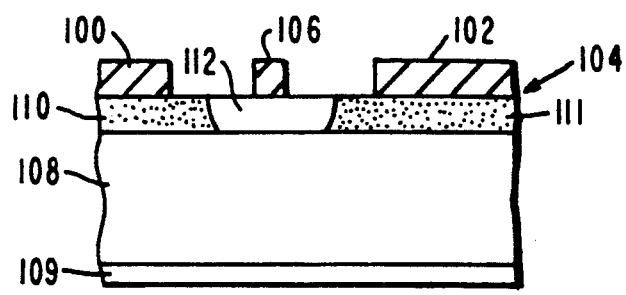
FIG. 1 is a cross-sectional view of a GaAs FET semiconductor device according to the prior art.

Although the buffer layer 212 adds some shunt capacitive effect between source 204 and drain 206, this effect is substantially less than the effect of the substrate 214 when it is present in the region (as is substrate 108 in the prior art device of FIG. 1). The amount of this undesired effect can be reduced substantially by proper dimensioning. The distance $d_1$ should be large in relationship to the thickness $t_2$ of the buffer layer 212, though in practice, $d_1$ and $t_2$ may be comparable. A two-to-one decrease in drain-source capacitance was obtained with $d_1$ equal to $t_2$.

To maintain a desirably low on-state resistance between source 204 and drain 206, high concentration n-type GaAs material should be used to make channel layer 210. N-channel doping of $2.5 \times 10^{17}$ cm$^{-3}$ is preferred. A device 202 constructed according to these specifications will have a cutoff frequency $f_{co}$ of 300 to 700 GigaHertz.

Buffer layer 212 is provided as an etch-stopping means to facilitate formation of the substrate removal region 218 using an etching process. When the device is formed by this process, an etchant is applied to the field plate 216 and then to the substrate 214 to remove portions of these layers. Buffer layer 212 is constructed of a material that is more resistant to the etchant selected than is the GaAs substrate 214. In the preferred embodiment to be described in detail with reference to FIG. 3, a reactive ion dry-etching process using $CCl_2F_2$ gas in a Helium carrier gas may be used, and in this case buffer layer 212 may be formed from undoped $Al_xGa_{1-x}As$ material (AlGaAs). It has been determined that material having a ratio of about one part Al to three parts Ga performs well for this purpose, so that $Al_{0.25}Ga_{0.75}As$ is preferred for forming buffer layer 212. The use of compounds with higher proportions of aluminum may result in undesired conductance properties of this layer. Generally, the Al components should be less than 0.30. During the etching process the entire substrate 214 should be removed in the selected substrate removal region 218, and a portion of the buffer layer 212 may also be removed if desired to further minimize capacitive effects in the region. The amount of material removed is in each case determined by the time of exposure to the etching solutions. Many other well-known etching solutions could also be used, so long as the buffer layer 212 is selected to be relatively more resistant to the etching solutions selected than is the substrate 214. Channel layer 210 should be constructed to have a predetermined thickness according to its design to provide a device 202 with predictable operational characteristics. Therefore, it is important that the etching process be stopped before any substantial part of the channel layer 210 is removed.

An additional benefit of the device of FIG. 2 constructed with buffer layer 212 is that the doping profile of the channel layer 210 will be more abruptly terminated at the interface of the channel layer 210 and the buffer layer 212 than in the conventional device of FIG. 1 where the channel layer adjoins the GaAs substrate. Thus, for a given channel thickness, lower off-state leakage current between source 204 and drain 206 can be achieved with an AlGaAs buffer layer according to FIG. 2.

Figure 3:
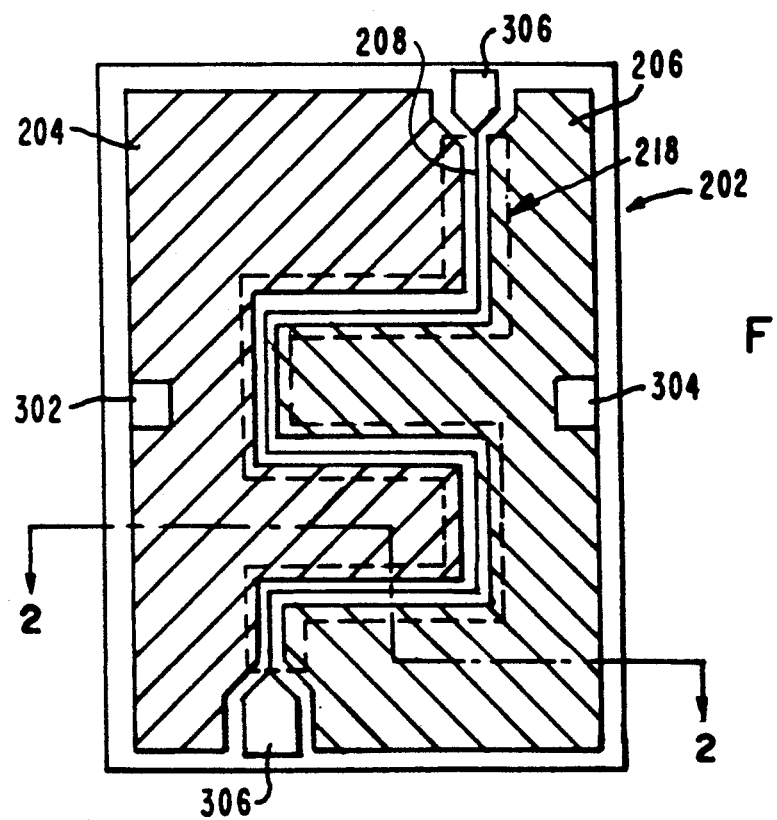
FIG. 3 is a top view of a GaAs FET chip according to the present invention showing the boundaries of the substrate removal region.

FIG. 3 is a top view of the device of FIG. 2 showing one preferred shape and location for the region beneath which there is no substrate. As shown in FIG. 3, gate 208 is laid out in a serpentine pattern and is connected to one or more gate contacts 306. A serpentine pattern is preferred to maximize the width of the path between source 204 and drain 206, thus minimizing on-state resistance of the device. Source 204 and drain 206 are laid out each on one side of gate 208 so that a substantially fixed distance D is maintained between source 204 and drain 206. Source 204 and drain 206 are provided with contacts 302 and 304 respectively. Gate 208 is located at a distance D/2 to each of source 204 and drain 206, so that gate 208 is centered between source 204 and drain 206. The substrate removal region 218 runs in parallel to and beneath gate 208. The substrate removal region 218 will preferably extend for a small distance, such as one to two microns, beneath source 204 and drain 206 to maximize the reduction in capacitive effect, although the invention also contemplates that substrate removal region 218 may have a width equal to or even less than the distance D between source 204 and drain 206. The substrate removal region 218 could also be extended further under source 204 and drain 206 if desired, but at the cost of some reduced structural strength of the device.

As shown, substrate removal region 218 is preferably located beneath gate 208 for most of the longitudinal dimension of gate 208, which is the width of the electron flow path between source 204 and drain 206. The benefits of the present invention are maximized by extending substrate removal region 218 along substantially all of the longitudinal dimension of gate 208 so that substrate removal region 218 underlies substantially the entire width of the path between source 204 and drain 206. In this way, the greatest possible reduction is achieved in the capacitance produced by substrate 214 between source 204, drain 206, and gate 208. However, if increased structural strength of the device 202 or reduced etching complexity are desired, it would also be possible to make substrate removal region 218 underlie only part of the path between source 204 and drain 206 or to etch a different pattern than the one shown. What is important, in the spirit of the invention, is that the substrate be removed or never formed beneath at least a portion of the channel layer 210 lying in the region between source 204 and drain 206.

Figure 4:
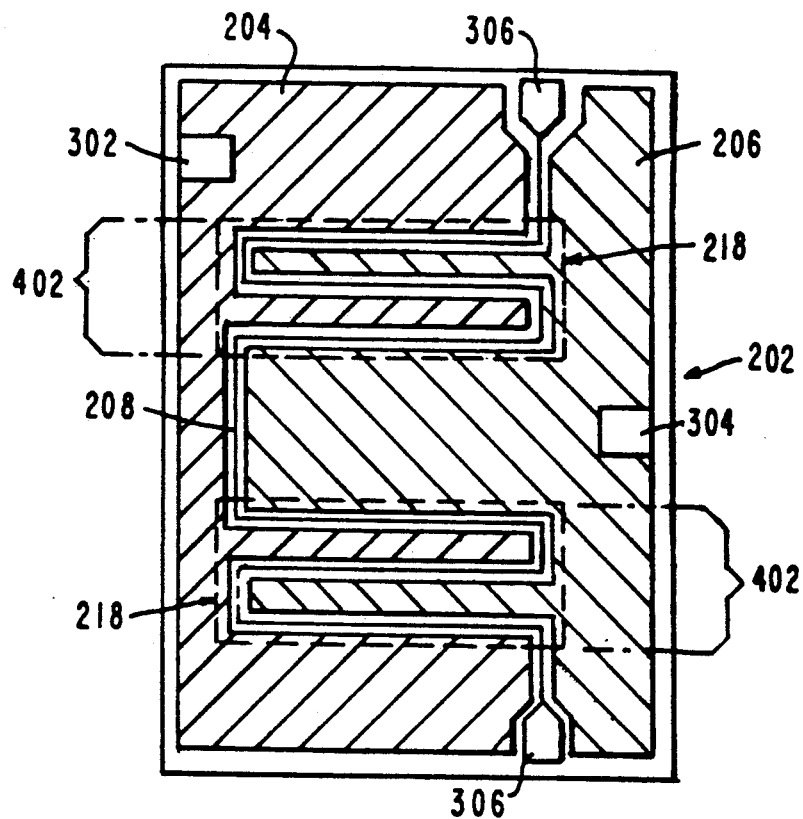
FIG. 4 is a top view of an alternative embodiment of FIG. 3 showing a simpler alternate substrate removal pattern.

FIG. 4 shows an alternate preferred pattern for arrangement of the source 204, drain 206, and gate 208 and for the removal or non-formation of the substrate. In this embodiment, the gate 208 is laid out to form packed regions 402. A packed region is one in which the gate 208 is arranged to closely parallel another of its paths, thus forming a region having a relatively high ratio of the total width of the source-to-drain path to the area of the region. In the embodiment shown, two packed regions 402 are provided, with two doublebacks of gate 208 in each packed region so that three source-to-drain paths are closely located. In this embodiment, two substrate removal regions 218 are provided. Each of the substrate removal regions 218 have a generally rectangular shape and are located beneath the packed regions 402. The substrate will not be removed under certain portions of the gate 208, such as the portion connecting the packed regions 402. However, the portions under which the substrate is not removed will constitute a relatively small part of the total width of the source-to-drain path in the device, so that much of the theoretically possible benefit of the present invention will be achieved. While some reduction in capacitance is sacrificed, several added benefits are achieved in this embodiment. The pattern for the etching of the substrate is less complex, so that higher production rates can be attained. Further, this design provides for the relatively fragile substrate removal regions 218 to be separated from one another and connected by more structurally robust regions having a full underlying substrate. This results in a physically stronger device, since there is no thinner region running across a substantial part of the device to define a potential "fault line." In this embodiment, defining the path of gate 208 to form the packed regions 402 makes it possible to remove substrate in a simpler, structurally stronger pattern while still removing the substrate beneath most of the total source-to-drain width of the device.

Figure 5:
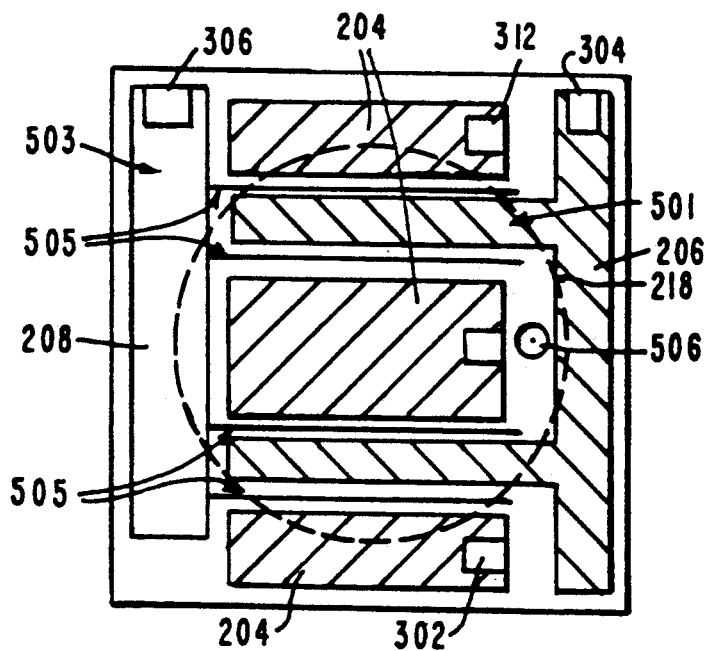
FIG. 5 is a top view of another alternative embodiment of FIG. 3 showing an alternate layout and substrate removal pattern.

FIG. 5 is a top view of another embodiment of the present invention. In this embodiment, the source 204 is divided into a plurality of physically separate regions, each connectable by contacts 302 to a single signal source. The drain 206 with contact 304 is arranged with finger portions 501 arranged to lie between adjacent separate regions of source 204. Gate 208 is arranged with a main section 503 connecting contact 306 to a plurality of protruding finger gate lines 505 extending in each location where sections of source 204 and drain 206 are in close proximity. A single substrate removal region 218 has a generally circular shape. Patterns for substrate removal region 218 which do not include corners or include few corners, such as patterns incorporating circular or otherwise elliptical components, may be desirable since these patterns can be easily formed by etching. The substrate removal region 218 may be dimensioned appropriately to underlie at least most of the length of finger gate lines 505 where they extend between source 204 and drain 206. In this embodiment, the arrangement of the source 204, drain 206, and gate 208 permits the efficient use of an elliptical substrate removal region 218.

The semiconductor device disclosed herein has numerous applications. The device is particularly applicable as a high-frequency switch, as a binary phase shifter for radar and other circuits, and as an analog phase shifter. In another application, since the device has more predictable capacitance than conventional devices, the present device could be used as a variable capacitor or varactor controlled by varying the gate voltage during operation in a range close to $V_{co}$.

Figure 6:
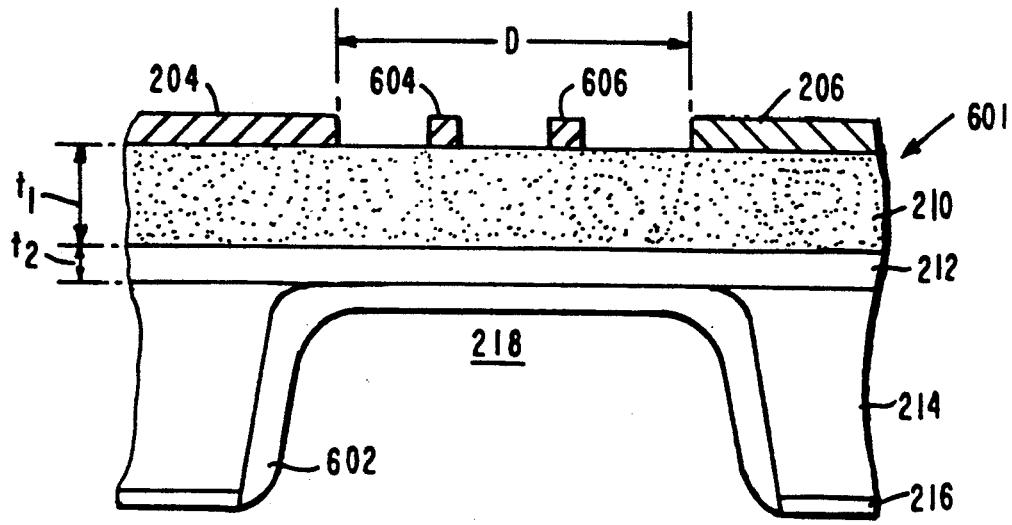
FIG. 6 is a cross-sectional view of a dual-gate semiconductor device constructed according to the precepts of the present invention, also showing the use of low-dielectric constant material to support the N-channel region.

Additional applications are made possible by forming a dual-gate semiconductor device 601 with two parallel gates 604 and 606 defining separate paths between separate contacts, as shown in FIG. 6. In this embodiment, the distance D between source 204 and drain 206 will be increased to approximately 15 microns. The device 601 can be used as a NOR logic gate since electron flow between source 204 and drain 206 will occur only when both of the gates 604 and 606 are in a ground state. Also, the device 601 can be used as a four-state selectable resistance if gates 604 and 606 are each energized with a different voltage or otherwise provided with differing characteristics such that the current flow from source 204 to drain 206 is different when gate 604 is energized from when gate 606 is energized. When gate 604 and gate 606 are both at ground, the source-to-drain resistance of the device 601 will be at a minimum level. When gate 604 and gate 606 are both at a negative cutoff voltage $V_{co}$, the resistance of device 601 will be at a maximum level. Two intermediate resistance levels can be created by separately energizing one of gate 604 and gate 606.

It will be generally desirable where possible to reduce the thickness $t_2$ of buffer layer 212 in the devices of FIGS. 2 and 6, so that D, $d_1$, and $t_1$ may be similarly reduced. The need for structural strength in the devices 202 and 601 is a constraint on the thicknesses $t_1$ and $t_2$. If $t_1$ and $t_2$ are reduced too much, the portion of the layers 210 and 212 adjoining region 218 will be susceptible to destruction from vibrational, torsional, temperature expansion, and other forces. In addition to illustrating the device 601, FIG. 6 illustrates a method applicable to all embodiments of the invention which increases the general structural strength of the device, thus permitting reduced thicknesses for $t_1$ and $t_2$. In this method, a low-dielectric constant material 602 is added to the substrate removal region 218 after removal of the substrate 214 from the region 218. Low-dielectric constant material 602 may be a polyimide organic passivation material and is deposited onto the portions of substrate 214 and buffer layer 212 defining substrate removal region 218. A thin layer of material 602 may be used or the entire region 218 may be filled with the material 602.

Figure 7:
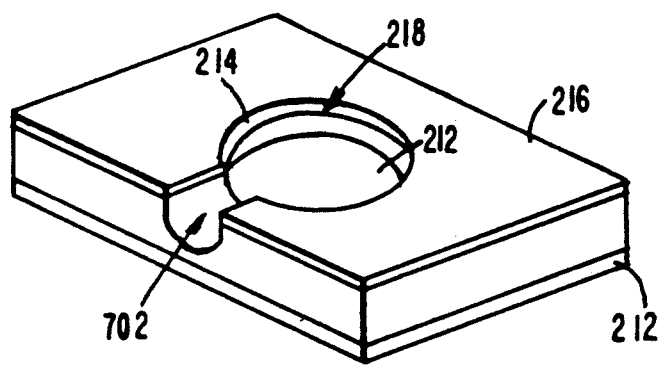
FIG. 7 is a view showing a GaAs FET chip according to the present invention with a pressure relief vent formed in the substrate.

FIG. 7 shows the back side of a device according to the present invention in which the substrate removal region 218 is provided with a vent passage 702 connecting substrate removal region 218 to the exterior of the substrate. In cases where the device will be mounted on its back side to a casing or other structure, the vent passage 702 provides a means for releasing changes in air pressure in the substrate removal region which may occur, for example, due to vibration of the thin portion of the device adjacent to substrate removal region 218, or due to temperature-related expansion of the air in substrate removal region 218 such as might occur during a soldering operation in close proximity to the device. By providing a means for venting the substrate removal region 218 to the outside, the vent passage 702 prevents damage to the thin layers 210 and 212 adjacent to the substrate removal region 218 from pressure or vibration. Another means of venting region 218 is through vent hole 506 (shown in FIG. 5) made through layers 210 and 212. Such a vent hole can be made by laser drilling or by chemical etching.

Figure 8:
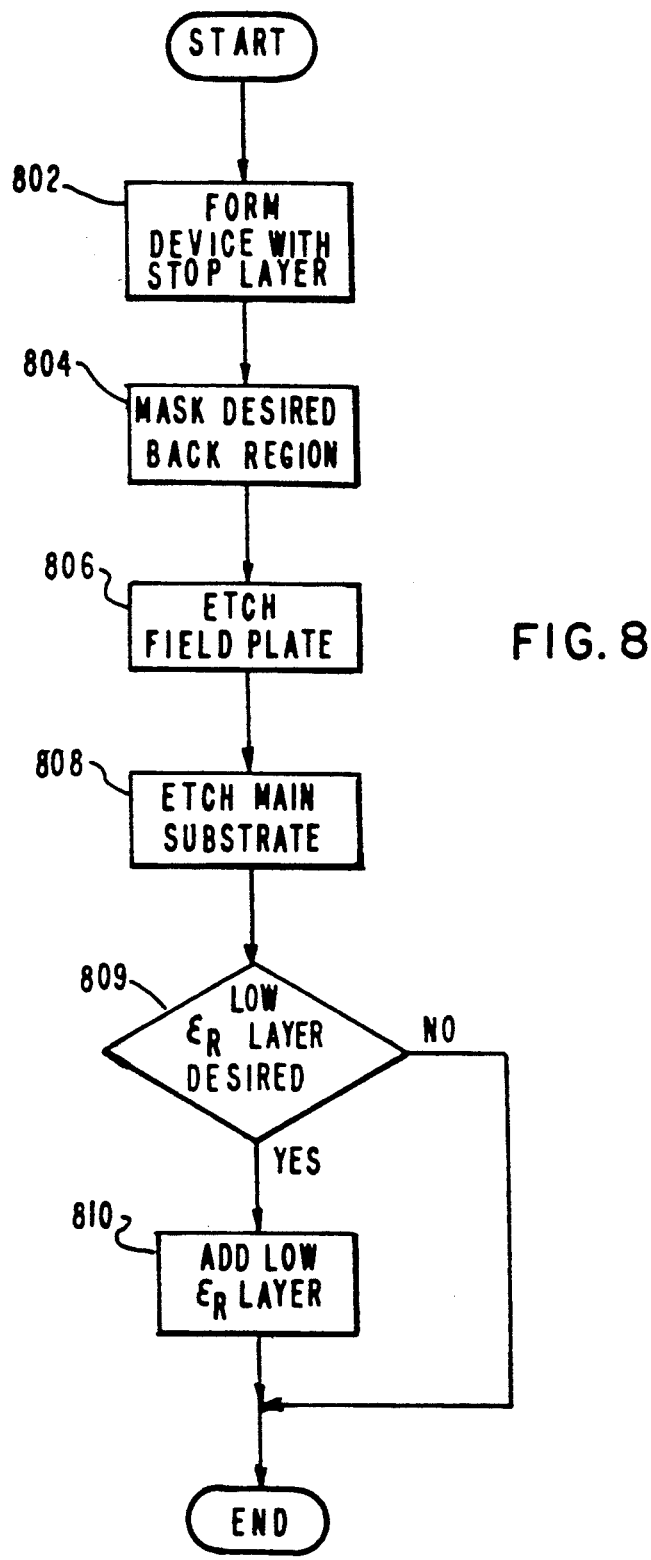
FIG. 8 is a flowchart showing the processing steps of the method of the present invention.

FIG. 8 is a flowchart for a preferred fabrication process useful in constructing the device of FIG. 2. The process begins in block 802 with the formation of a device on a substrate of uniform thickness, with the device including a stop layer between the substrate of the device and active parts of the device. The material for the stop layer is selected in conjunction with an etching solution to provide relatively greater resistance to the action of the etching solution than is provided by the substrate. In an exemplary embodiment, this device may be a generally conventional GaAs FET such as the GaAs FET of FIG. 1, with the addition of a stop layer between the substrate 108 and channel layer 104. In this exemplary embodiment, the substrate is of GaAs, the etching solution used is $CCl_2F_2$ gas in a Helium carrier gas, and the stop layer may be of $Al_{0.25}Ga_{0.75}As$ as described previously. Of course, the device may also be formed with alternate source, drain, and gate arrangements as disclosed above.

Next, in block 804, the portions of the back side of the device which are to be etched away are identified, and the portions which are not to be etched are masked off so that only the regions to be etched, corresponding to the substrate removal region 218 shown, for example, in FIGS. 3, 4, or 5, are exposed to the etching chemicals.

The processing will be described in terms of etching, since etching is the most economical process currently available for removing material precisely to micron dimensions. However, the etching described herein is merely an example of a means for precision removal of material; any other appropriate precision material removal process available or which may be developed could also be used. The actual etching processes used herein are conventional; it is the location, depth, application, and purpose of the etching that are novel. The etching may occur in one or more steps, and the processes and compounds chosen will depend in each case on the material to be removed. In the exemplary embodiment, in which a GaAs FET is to be manufactured, the field plate at the bottom of the substrate is first etched away (block 806) by exposing the masked device to a solution of a Potassium Iodide (KI) based etch followed by buffered Hydrofluoric acid (HF) for an appropriate time period based on the thickness and material type of the field plate layer. Then, in block 808, the GaAs substrate material is etched using a reactive ion dry-etching process with $CCl_2F_2$ gas in a Helium carrier gas, again for a time appropriate to the thickness of the GaAs substrate and the thickness of the stop layer so that the substrate is fully etched away by this processing step but the stop layer is not. If desired, a third processing step could be introduced as part of the substrate etching process to remove additional portions of this stop layer. For example, an AlGaAs stop layer could be removed to the bottom of the N-channel layer by a wet chemical etching method using, e.g. Hydrofluoric acid (HF).

To complete the process, if it is desired to add a layer of low-Epsilon material to the substrate removal region formed by the processes of blocks 806 and 808, this layer can be deposited into the cavity as shown in block 810.

The processing steps described are particularly appropriate for manufacturing a GaAs FET semiconductor as previously described herein. Depending on the structure of the device to be manufactured using this process, any number and types of layers of the device may be removed from the back of the device to reduce capacitance and improve device operation. The processing steps required to remove specific back layers for a particular application are chosen in conjunction with the design of the device, including the material and thickness of the layers, to provide a device that is easily constructed by the process. For example, in the exemplary embodiment, the device is designed with a stop layer of AlGaAs which is chosen because it has a differing level of resistance to at least one etchant as compared to GaAs, the substrate material to be removed. In this way, an etchant can be applied to remove the back layer producing an undesired coupling effect without damaging the desired active portions of the device. Clearly, differing stop layer materials and etchants will be appropriate for manufacturing different semiconductor devices according to these precepts, and the invention is not intended to be limited to the exemplary embodiments disclosed herein.

We claim:

1. A semiconductor device comprising:
   a substrate of semi-insulating material having a thickness, an active side, and a back side opposed said active side;
   an active layer disposed on the active side of the substrate, said active layer further comprising a functional semiconductor device having a portion exhibiting sensitivity to capacitive effects of the substrate material;
   at least one removal area in the substrate defined by a region devoid of substrate material and located proximate said portion of the active layer exhibiting sensitivity to capacitive effects, with said removal area containing matter having a lower dielectric constant than the material of the substrate; and
   wherein the matter in the removal area includes a polyimide.

2. A semiconductor device comprising:
   a substrate of semi-insulating material having a thickness, an active side, and a back side opposed said active side;
   an active layer disposed on the active side of the substrate, said active layer further comprising a functional semiconductor device having a portion exhibiting sensitivity to capacitive effects of the substrate material;
   at least one removal area in the substrate defined by a region devoid of substrate material and located proximate said portion of the active layer exhibiting sensitivity to capacitive effects, with said removal area containing matter having a lower dielectric constant than the material of the substrate; and
   wherein the junctioned semiconductor device is a field effect transistor and the active layer comprises one or more layers defining source, gate, and drain regions and a channel layer providing an electron path between the source and drain regions.

3. The device of claim 2 wherein the removal area is located proximately to the region of the channel layer.

4. The device of claim 3 wherein there are provided two separately controllable gate regions to form a dual-gate device.

5. The device of claim 3 wherein the semiconductor device is a GaAs FET, and the substrate is a GaAs wafer.

6. The device of claim 5 wherein the channel layer is an N-channel GaAs layer.

7. The device of claim 5 wherein the channel layer is a HEMT layer.

8. The device of claim 5 wherein the device includes an inactive buffer layer between the substrate and active layers.

9. The device of claim 8 wherein the buffer layer is resistive to etching by at least one compound that will readily etch the substrate material.

10. The device of claim 9 wherein the buffer layer is an AlGaAs layer.

11. A semiconductor device comprising:
    a substrate of semi-insulating material having a thickness, an active side, and a back side opposed said active side;
    an active layer disposed on the active side of the substrate, said active layer further comprising a functional semiconductor device having a portion exhibiting sensitivity to capacitive effects of the substrate material;
    at least one removal area in the substrate defined by a region devoid of substrate material and located proximate said portion of the active layer exhibiting sensitivity to capacitive effects, with said removal area containing matter having a lower dielectric constant than the material of the substrate; and
    means for relieving pressure differentials between the removal region and the external atmosphere in contact with said active side.

12. A semiconductor device comprising:
    a substrate of semi-insulating material having a thickness, an active side, and a back side opposed said active side;
    an active layer disposed on the active side of the substrate, said active layer further comprising a functional semiconductor device having a portion exhibiting sensitivity to capacitive effects of the substrate material;
    at least one removal area in the substrate defined by a region devoid of substrate material and located proximate said portion of the active layer exhibiting sensitivity to capacitive effects, with said removal area containing matter having a lower dielectric constant than the material of the substrate; and
    wherein the device further includes a ventilation pathway between the removal region and the atmosphere in contact with said active side.

13. A semiconductor device comprising:

a semi-insulating substrate having a thickness, an active side, and a back side on the obverse of the active side;

one or more active layers disposed on the active side of the substrate, said active layer further comprising a junctioned semiconductor device having a portion exhibiting sensitivity to capacitive effects of the substrate material;

means for reducing the dielectric constant of the substrate proximate the portion of the active layer sensitive to capacitive effects of the substrate material; and wherein the junctioned semiconductor device is a field effect transistor and the active layer includes at least one contact layer defining source and drain regions and a gate region at least partially interposed on a source-drain path between the source and drain regions, and a channel layer between the contact layer and the substrate.

14. The device of claim 13 wherein the means for reducing the dielectric constant of the substrate comprises a removal region beneath the source-drain path where substrate material has been removed.

15. The device of claim 14 wherein the back of the substrate is etched so that there is substantially no substrate material under a majority of the source-drain path.

16. The device of claim 15 wherein the source and drain regions have a plurality of finger regions defining a serpentine shape of the source-drain path and the portions of the gate region interposed on the path.

17. The device of claim 16 wherein the removal region has a serpentine shape corresponding substantially to the shape of the source-drain path.

18. The device of claim 16 wherein the serpentine paths define at least one packed region in which the source-drain path doubles back on itself repeatedly and in close proximity to produce in the packed region a high ratio of the total width of the source-drain path to the area of the packed region.

19. The device of claim 18 wherein the removal region is located under the packed region.

20. The device of claim 19 wherein the removal region is rectangular and underlies less than the entire longitudinal dimension of the source-drain path.

21. The device of claim 19 wherein there are a plurality of packed regions in the same device.

22. The device of claim 21 wherein a plurality of removal regions are provided to underlie each packed region, with the removal regions together underlying less than the entire source-drain path.

23. The device of claim 15 wherein one of the source and drain regions consists of a plurality of geographically separate but electrically connected regions and the other of the source and drain regions has a plurality of finger regions extending in a first direction between the geographically separate regions, forming a plurality of source-drain paths, and wherein the gate region has a plurality of finger regions extending along the source-drain paths in a second, opposite direction from the first.

24. The device of claim 23 wherein the removal region is elliptical and underlies substantially all of the area of the plural source-drain paths.

* * * * *